(12) United States Patent
Burdick

(10) Patent No.: US 6,813,129 B2
(45) Date of Patent: Nov. 2, 2004

(54) SELF-DIAGNOSTIC SOLID STATE RELAY FOR DETECTION OF OPEN LOAD CIRCUIT

(75) Inventor: Robert C. Burdick, Romulus, MI (US)

(73) Assignee: Alcoa Fujikura Limited, Franklin, TN (US)

(*) Notice: Subject to any disclaimer, the term of this patent is extended or adjusted under 35 U.S.C. 154(b) by 0 days.

(21) Appl. No.: 10/023,270

(22) Filed: Dec. 14, 2001

(65) Prior Publication Data

US 2003/0112571 A1 Jun. 19, 2003

(51) Int. Cl.$^7$ ................................................ H02H 5/04
(52) U.S. Cl. .......................... 361/104; 361/54; 361/99
(58) Field of Search ................................ 361/100, 104, 361/18; 337/139

(56) References Cited

U.S. PATENT DOCUMENTS

| | | | |
|---|---|---|---|
| 3,729,671 A | 4/1973 | Jeffery et al. .................. | 321/11 |
| 4,038,584 A | 7/1977 | Tarchalski et al. ........... | 361/104 |
| 4,054,934 A | 10/1977 | Riebs ............................ | 361/93 |
| 4,075,592 A | * 2/1978 | Schroeder .................... | 337/139 |
| 4,351,014 A | 9/1982 | Schofield, Jr. ............... | 361/100 |
| 4,849,849 A | 7/1989 | Zucker et al. ................ | 361/92 |
| 5,536,980 A | 7/1996 | Kawate et al. ............... | 307/116 |
| 5,570,666 A | 11/1996 | Rymut et al. ............ | 123/145 A |
| 5,729,456 A | 3/1998 | Boisvert et al. ........ | 364/431.01 |
| 6,154,122 A | 11/2000 | Menze ..................... | 340/425.5 |

* cited by examiner

Primary Examiner—Gregory J. Toatley, Jr.
Assistant Examiner—Boris Benenson
(74) Attorney, Agent, or Firm—Tracey D. Beiriger

(57) ABSTRACT

A self diagnostic solid state relay for converting a low current input into a high current output and providing the combined functions of silent switching and visual indication of circuit status. A three dimensional polygonal shaped housing encloses a printed circuit board. A MOSFET field effect transistor, a pair of female circuit board terminals, and a pair of LED elements are electrically communicable with a first side of the printed circuit board, the LED elements further being viewable from an exterior location of the housing. A fuse including first and second spaced apart and extending blade portions engage, respectively, with the first and second female terminals through openings defined in the housing. A plurality of male circuit board terminals are in electrical communication with a second side of said printed circuit board and extend from further selected exterior locations of the housing. The first LED element illuminates to indicate an open circuit due to an open OCPD operating condition of the relay, whereas the second LED element illuminates to indicate a partial or total open load circuit operating condition.

13 Claims, 3 Drawing Sheets

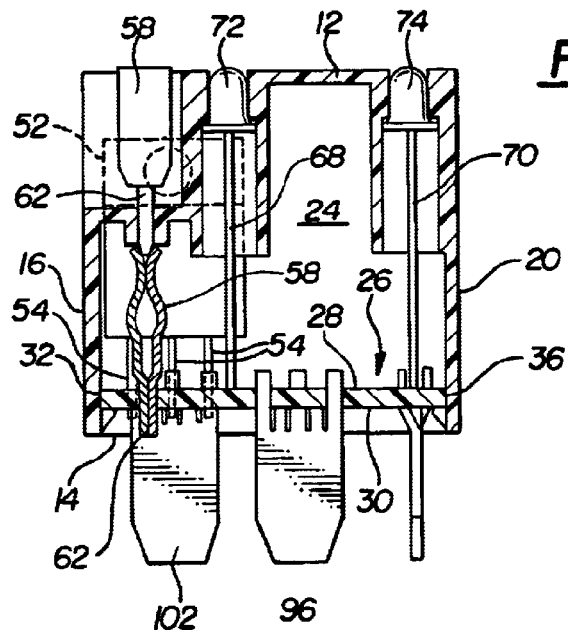
FIG-3
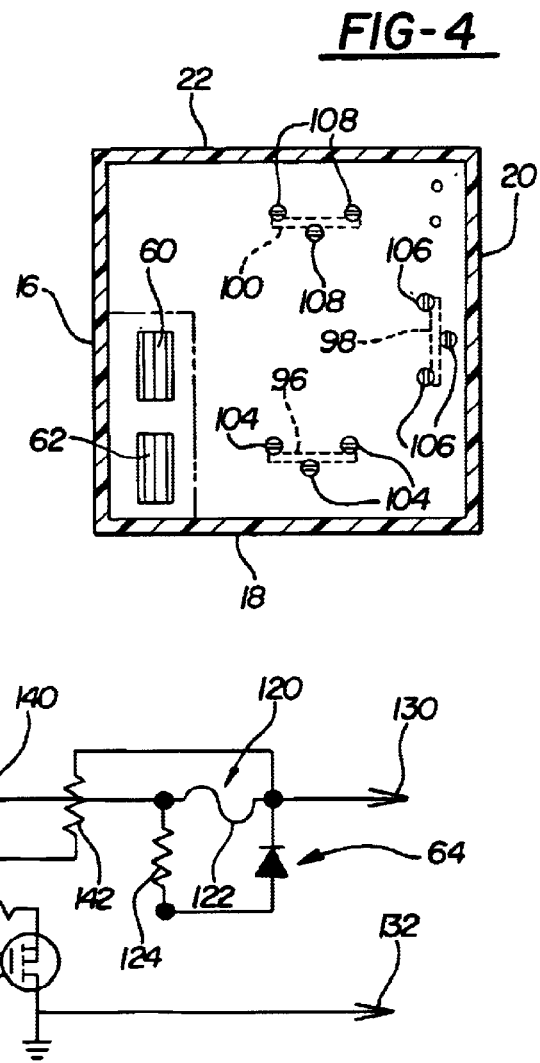
FIG-4
FIG-5

SELF-DIAGNOSTIC SOLID STATE RELAY FOR DETECTION OF OPEN LOAD CIRCUIT

FIELD OF THE INVENTION

The present invention relates generally to electrical relay devices. More particularly, the present invention is a solid state relay for converting a low current input into a high current output and which provides the combined functions of silent switching and visual indication (LED indicators) of circuit status built directly into the relay housing. In this fashion, the relay provides circuit diagnostic capabilities to notify the user of an open or partially open load condition.

BACKGROUND OF THE INVENTION

The prior art is well documented with examples of electrical current relay devices, such as are typically employed in vehicle electrical systems. In particular, reference is made to prior art electromechanical and standard ISO relays, examples of which typically incorporate large electronic circuits on printed circuit boards which contain mechanical switches and relays.

One example of the prior art is illustrated in U.S. Pat. No. 4,038,584, issued to Tarchalski, and which discloses a protective arrangement for dependent switching circuits including a fusible resistor in a solid state relay comprising two solid state switches connected in parallel with each other and in series with a load and a source of current. Then the first of the two switches is switched on, the second switch also switches on and conducts, supplying sufficient current to the load to thus reduce the voltage across both switches to that of the voltage drop across the second switch. Upon the second switch failing to become turned on when the first switch is turned on, a higher voltage is experienced across the first switch causing excessive circuit flow through the first switch. At this point, a fusible resistor, located in the circuit of the first switch, is opened at such time and in order to prevent first resulting from overheating of the circuit.

U.S. Pat. No. 4,351,014, issued to Schofield, Jr. discloses a solid state self-checking relay including a main switch adapted to be connected in series with a load and voltage source and responsive to relay opening and closing signals. A secondary switch is connected in parallel with the load and is switched a sense opposite that of the main switch by the relay opening and closing signals. If the main switch fails to open, the secondary switch is closed and the load is short circuited by it. Additionally, a fuse in series with the main switch is blown by the current through the secondary switch in order to latch the relay in the open circuit condition. Self-checking circuits are provided to latch the relay in an open circuit condition if there is any circuit failure.

U.S. Pat. No. 4,280,161, issued to Kuhn, teaches an over-voltage protection network system, particularly for use in preventing over-charging of a car battery such as which typically occurs upon failure of the voltage regulator to control current flow through the field of an automotive alternator. A field current of the circuit is conducted through an interruptible network element, for example a fuse or a relay controlled switch. A voltage sensing network, for example a Zener diode, is connected to control current flow through a controlling element, for example a thyristor, which provides either an auxiliary current to bum out the fuse or a control current to the relay coil to interrupt connection to the field if over-voltage has been sensed. Simultaneously, an indicator lamp is energized to indicate malfunction of the voltage regulator.

Finally, U.S. Pat. No. 4,054,934, issued to Riebs, teaches a solid-state inverse overcurrent relay having a long slender wire connected to respond to a current which is proportional to the line current in a power system. An infrared detector or phototransistor is positioned to sense a predetermined color of radiation from the wire and is connected to fire a silicon controlled rectifier which is connected in series with a trip coil for a circuit breaker. The trip coil and silicon controlled rectifier are connected to an independent DC power source. The long slender wire on energization responds to the current which is proportional line current with the same time current characteristic as a fuse. In an alternate embodiment of the invention the relay is connected to the power system through a bridge rectifier which provides the DC current for operating both the heat responsive wire as well as the infrared detector.

SUMMARY OF THE INVENTION

The present invention is a solid state relay for converting a low current input into a high current output and which provides the combined functions of silent switching and visual indication of circuit status built directly into the relay housing. The present invention therefore provides circuit diagnostic capabilities to the relay and which notify the user of an open or partially open circuit load condition.

A three dimensional polygonal shaped housing, preferably cubicle shape, encloses a printed circuit board. The circuit board in the preferred variant defines a bottom side portion of the housing. A MOSFET field effect transistor, a pair of female circuit board terminals, and a pair of LED elements are all electrically communicable with a first side of the printed circuit board in enclosed fashion within the housing. Illuminating head portions of the LED elements extend through apertures defined in a top facing side of the housing and are viewable from an exterior location of the housing.

A fuse includes first and second spaced apart and extending blade portions engageable, respectively, with the first and second female terminals and through additional openings defined in the top face of the housing. A plurality of four male circuit board terminals are in electrical communication with a second side of the printed circuit board, corresponding to the bottom facing side of the housing, and extend from further selected exterior locations of the housing.

A first switching condition contained within a single open load detection portion of the circuit, causes the first LED element to illuminate, indicating an open circuit operating condition of the relay. A second switching condition contained within a multiple open load detection portion of the circuit, causes the second LED element to illuminate, indicating a partial or total open circuit load operating condition.

BRIEF DESCRIPTION OF THE DRAWINGS

FIG. 3 is a cutaway view of the relay housing and illustrating, from a side profile, the assembly configuration of the Mini Fuse, LEDs, MOSFET Transistor, Female PCB Terminals, Printed Circuit Board and Male PCB Terminals;

FIG. 4 is a second cutaway view of the relay housing and illustrating, from a bottom looking direction, the arrangement of the Male and Female PCB Terminals;

FIG. 5 is a first schematic of a single open load detection circuit for alerting a user of an open fuse/shorted circuit condition or open load.

DETAILED DESCRIPTION OF PREFERRED EMBODIMENTS

Figure 1:
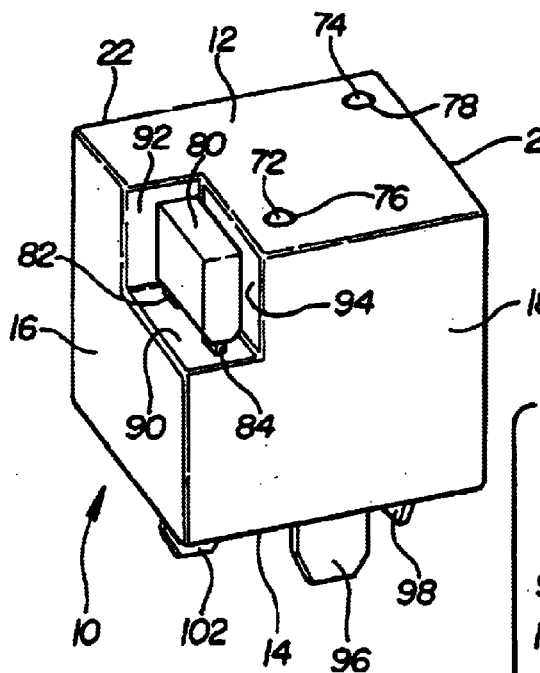
FIG. 1 is a perspective view of the self-diagnostic solid state relay according to the present invention.
Figure 2:
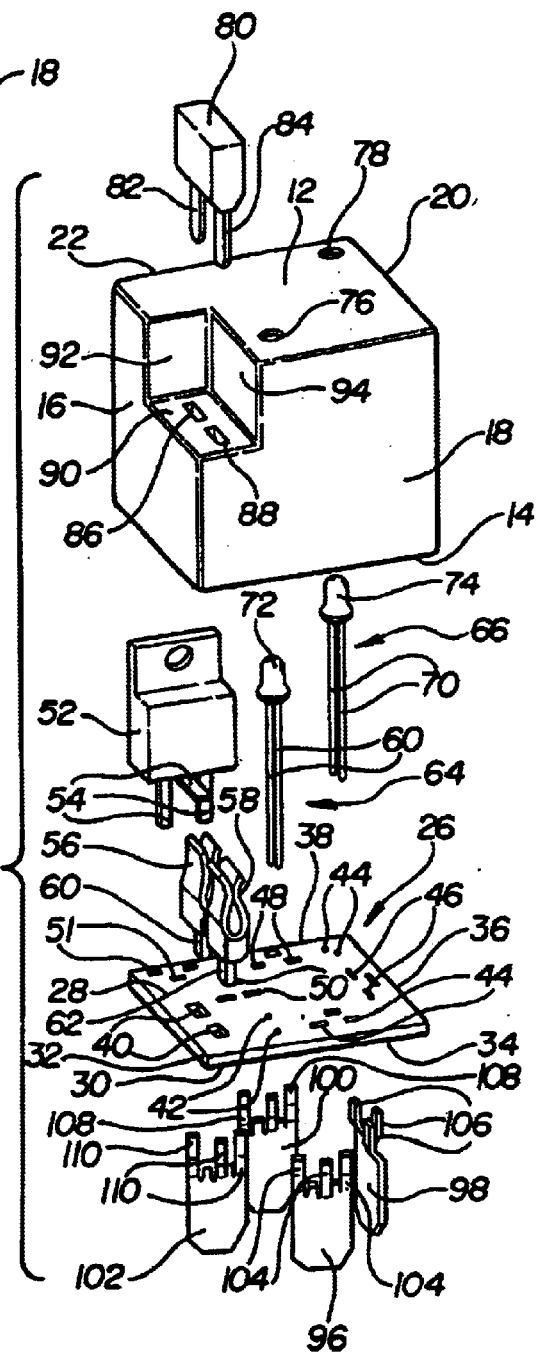
FIG. 2 is an exploded view of the solid state relay and illustrating its various components.

Referring now to FIGS. 1 and 2, a self diagnostic and sold state relay is illustrated at 10 according to the present invention. As previously explained, the present invention provides a completely solid state (no electromechanical switching components) relay for converting a low current input into a high current output and which further provides the combined functions of silent switching and visual indication of circuit status built directly into the relay housing, typically in the form of LED indicators. The present invention therefore provides circuit diagnostic capabilities to the relay which notify the user of an open or partially open load condition and which has not heretofore been known in the relevant art.

The relay 10 includes a three dimensional housing, preferably in a cuboidal shape and including a top facing edge surface 12, a bottom facing edge surface 14, and first 16, second 18, third 20 and fourth 22 interconnected side surfaces. The relay housing is typically constructed of a durable and polymer based material, providing the necessary properties of electrical and environmental insulation, and the top, bottom and interconnected sides define in combination a substantially open interior 24 (see FIG. 3). It is further understood that the shape or configuration of the three dimensional housing can be modified within the scope of the invention.

A substantially planar printed circuit board, illustrated generally at 26, is provided according to a substantially planar configuration and includes a first side 28, a second side 30, and a plurality of four interconnecting and extending side edges 32, 34, 36 and 38. As best illustrated in the exploded perspective of FIG. 2, the circuit board 26 includes internally configured solder patterns according to a desired arrangement and further includes a number of apertures, including pairs of apertures at 40 and 42 and sets of three apertures apiece at 44, 46, 48 and 50, and which correspond to locations proximate each of the four sides 32, 34, 36 and 38 of the circuit board. An additional plurality of apertures is further illustrated at 51 at a further segregated location of the circuit board 26 and, along with the apertures defined at 40, 42, 44, 46, 48 and 50, communicate with various locations of the circuit board 26.

As best shown again in FIG. 2, and referring further to the side cutaway profile of FIG. 3, the size and substantially square (or rectangular) edge configuration of the circuit board 26 permits it to be engageable within an open bottom of the housing (corresponding to the bottom facing side 14) and with the exterior facing side edges 32, 34, 36 and 38 of the circuit board biasingly engaging against corresponding and interiorly facing surfaces associated with sides 16, 18, 20 and 22 of the housing. In this fashion the printed circuit board 26 will in effect define the bottom facing edge of the housing and it is also envisioned that a flowable/hardenable material, such as an electrically isolating epoxy, can be applied over the second (and downwardly facing) side 30 at some point during the construction of the relay.

A number of circuit components are assembled in electrical communication with the circuit board 26. These include a field effect transistor (MOSFET) 52 including a plurality of three 54 downwardly extending tangs which engage within the selected subset plurality 51 of apertures defined in the circuit board 26 to affix the MOSFET 52 thereto. A second input MOSFET 152 is also included to provide a signal to MOSFET 154 (also 52).

A pair of female circuit board terminals 56 and 58 are provided, each in turn including a downwardly extending pin portion (see at 60 for female terminal 56 and at 62 for female terminal 58). The pin portions 60 and 62 engage, respectively, individual ones of the pair of apertures 40 in the circuit board 26.

A pair of first 64 and second 66 light emitting diode (LED) elements are provided and each include extending stem portions (see pair of stem portions 68 for first LED 64 and pair of stem portions 70 for second LED 66). Bottom extending edges of the pairs of stem portions 68 and 70 engage, respectively, within the pairs of apertures 42 and 44 defined in the circuit board 26. The LED elements 64 and 66 each further include an illuminating head portion connected to upper extending ends of the stem portions (see head portion 72 connected to stem portions 68 of first LED 64 and head portion 74 connected to stem portions 70 of second LED 66).

The top facing edge surface 12 of the relay housing includes apertures 76 and 78, corresponding to generally opposite edge locations, and through which the respective extending head portions 72 and 74 of the first and second LEDs 64 and 66. It is also envisioned that the LED elements 64 and 66 may each illuminate any selected color, such as for example red for the first LED 64 and yellow for the second LED 66.

A fuse is illustrated at 80 and includes first and second spaced apart and extending blade portions 82 and 84. A pair of apertures 86 and 88 are defined at further selected locations of the relay housing and, in the preferred embodiment, includes a recessed edge location defined within a three dimensional recess defined between the top surface 12 and the first 16 and second 18 sides of the housing. The recess is further defined by a bottom surface 90, through which is defined the apertures 86 and 88, and interconnecting side surfaces 92 and 94, in turn extending upwardly to the top edge surface 12.

The configuration of the three dimensional edge recess is such that the fuse 80 may be installed from an exterior edge location of the relay housing in a relatively unobtrusive fashion and is further easily replaceable upon being burned to create an "open circuit" condition, and as will be subsequently described in further detail. Further, and as is best illustrated in FIGS. 2 and 3, the extending ends of the blade portions 82 and 84 of the fuse 80 engage with the first and second female terminals 56 and 58 upon being assembled upon the relay housing.

A plurality of four male circuit board terminals 96, 98, 100 and 102 are provided, each including a plurality of extending tang portions which associate and engage with a selected sub-plurality of apertures defined within the circuit board. Specifically, male terminal 96 includes a plurality of three extending tangs 104, which engage with the apertures 44. Similarly, extending tangs 106 (corresponding with male terminal 98), tangs 108 (corresponding with male terminal 100) and tangs 110 (corresponding with male terminal 102) engage, respectively, with the previously described apertures 46, 48 and 50.

The male terminals 96, 98, 100 and 102 therefore extend from the substantially bottom facing edge surface 14 of the housing, by virtue of the respective tangs 104, 106, 108 and 110 engaging second facing side 30 of the printed circuit board 26. As further previously described, an insulating and viscous sealing material may again be applied (not shown) over the mating engaging of the circuit board 26, after it has been attached to the bottom edge 14 of the substantially interiorly hollowed housing and further following the assembly of the male terminals 96, 98, 100 and 102.

Figure 6:
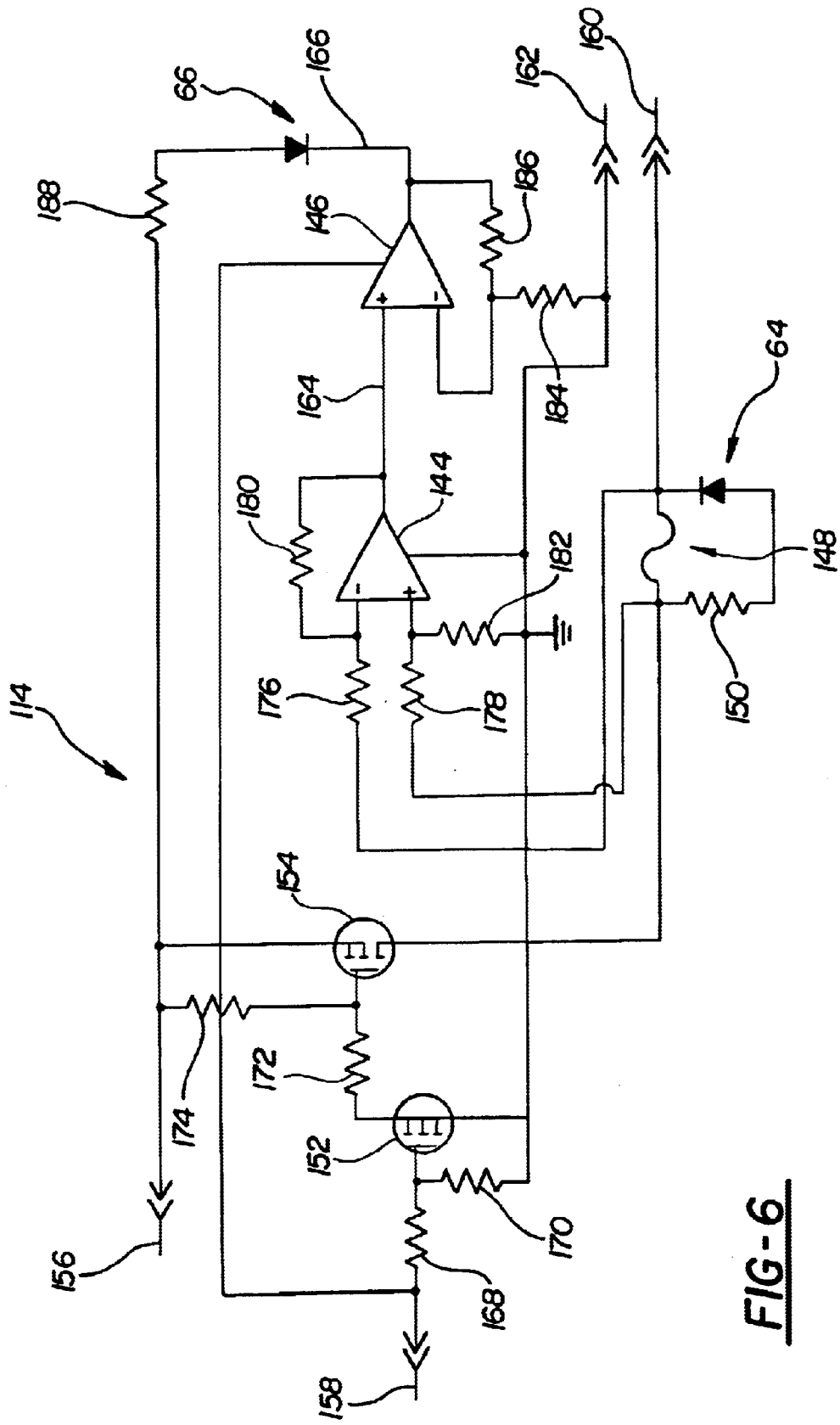
FIG. 6 is a second schematic of a double open load detection circuit for alerting a user of a partial or total open load or under drawing circuit condition, as well as open fuse/shorted circuit condition.

Referring now to FIGS. 5 and 6, schematic illustrations are shown of both a single open load detection circuit 112 (FIG. 5) for determining an open circuit condition and a multiple open load detection circuit 114 (FIG. 6) for determining a partially open and current under-drawing condition. The load detection circuits 112 and 114 are incorporated into the structure of the printed circuit board 26 and switching capabilities are associated with each of the detection circuits 112 and 114 for illuminating, in the case of load detection circuit 112, the first red LED 64, and upon occurrence of the open first circuit condition (or the first switching condition) and whereupon the fuse 80 has been "blown" or burned out by virtue of an exceedingly large flow of current beyond the fuses rating. In the instance of the partially open second circuit condition (or the second switching condition) or load under-drawing detection circuit 114 (again FIG. 6), the second yellow LED 66 may be illuminated to indicate that condition. A more detailed description of the specifics of each of the circuits 112 and 114 will now be given and as follows.

Referring again to FIG. 5, the single open load detection circuitry 112 includes schematic representation of first 116 and second 118 field effect transistors, or MOSFETS. The first MOSFET 116 provides power switching of the circuit and the second MOSFET 118 provides open load detection capability. An over current protection device (OCPD) 120 is connected to an output of the power MOSFET 116 and the OCPD 120 further includes such as a fuse or PTC 122 having an appropriately rated resistor 124.

The first LED 64 (red) is connected in parallel configuration with the OCPD 120 and, upon the OCPD 120 ceasing to pass current (such as caused by the fuse burning out) electrical current will flow through the red LED 64 causing it to emit (or illuminate). The first open load detection circuit 112 further includes parallel input lines 126 (connected to a battery or suitable power source) and 128 (connected to a signal input). Parallel extending output lines are also indicated at 130 (connected to any desired load output) and 132 (connected to ground). Various additional resistor components 134, 136, 138, 140 and 142 are illustrated throughout the schematic of FIG. 5 and are selected according to desired ratings to effectuate the necessary functioning of the circuit.

Referring again to the multiple first open load detection circuit 114 of FIG. 6, a more detailed explanation will now be given as to its functionality for determining the existence of a partially open or load under-drawing capacity. In this condition, the fuse (see again 80 in FIG. 1) has not been burned out so as to create an open circuit, but the non-operation of a load drawing component or vehicle accessory (such as a vehicle head lamp) is identified by the circuit 114. Input to determine switching conditions will be triggered when a user, for example, actuates the head lamp switch, which provides the input signal for MOSFET 152.

Specifically, the circuit 114 includes a dual operational amplifier (OPAMP) identified schematically by components 144 and 146 arranged in series. The first stage OPAMP 144 is connected in parallel with the over current protection device (OCPD) herein illustrated at 148 and again as such may include a suitable resistor component 150. MOSFET components 152 (signal inverter) and 154 (switching) are also schematically arranged at the input side of the OCPD 148 and second LED 66 (yellow). The partially open/under-drawing load detection circuit 114 further includes parallel input lines 156 (connected to a battery or suitable power source) and 158 (connected to a signal switching input). Parallel extending output lines are also indicated at 160 (connected to any desired load output) and 162 (connected to ground).

The multiple open load detection circuit 114 is unique in that, unlike other detection circuits, a voltage level is measured and is required to change the state (switching) of the circuit. This is opposed to prior art applications, which utilize a current flow measurement of some fashion and in order to operate the electro-mechanical switching associated with the circuit.

Specifically, the first stage 144 of the dual OPAMP operates to multiply a voltage level present across the OCPD 148 (according to a desired multiplier), the output of which is then communicated (along line 164) to the second stage 146 of the dual OPAMP. The second OPAMP 146 is configured as a comparator and monitors the signal from the differential amplifier (first stage OPAMP 144) and, upon a voltage level of the differential amplifier/first stage OPAMP 144 reaching a predetermined threshold, the comparator/second stage OPAMP 146 switches state allowing current to flow through the second LED 66 (yellow) which is communicated to the comparator 146 output (by communication line 166).

Accordingly, the second LED 66 will emit (illuminate) light when part or all of the load being switched by the MOSFET (see again at 152 and 154) is not present. Further, and as with the open load circuit 112, various additional resistor components 168–188 are illustrated throughout the schematic of FIG. 6 and are selected according to desired ratings to effectuate the necessary functioning of that circuit.

It is evident therefore that the present invention provides a novel self diagnostic and solid state relay, unencumbered by prior art electro-mechanical switching components, and which provides for upgradeability of the electrical system components of both new and used vehicles to incorporate self-diagnostic capacity without altering the original electrical system wiring. Additional benefits include the ability to customize new applications for vehicle wiring systems, by virtue of the small size and configuration of the solid state relay housing, and without the need for incorporating large printed circuit boards and housings.

The present relay also will operate with other off the shelf components (not shown), thus reducing tooling investment. Still additional benefits include silent switching of the relay as well as avoiding the necessity of having to replace such mechanical parts (resulting again from the absence of electro-mechanical switches), visual indication of circuit states (again red LED 64 or yellow LED 66), intelligent diagnostics for sensing partial loads when the fuse is sized to the load (circuit 114), and the ability of the relay to function for all load values sized to the fuse and for protecting the circuit.

Having described the presently preferred embodiments, it is to be understood that the invention may be otherwise embodied within the scope of the appended claims.

What is claimed is:

1. A self diagnostic solid state relay, comprising:
a three dimensional housing enclosing a printed circuit board;
a field effect transistor, at least one female circuit board terminal, and at least two LED elements being electrically communicable with said printed circuit board and located on a first side of said printed circuit board, said LEDs being viewable from an exterior location of said housing;

a fuse engageable with said at least one female terminal through an opening defined in said housing;

a plurality of male circuit board terminals being in electrical communication with said printed circuit board and located on a second side of said printed circuit board, and extending from further selected exterior locations of said housing, said field effect transistor, LED elements, fuse and male and female terminals in electrical communication via the printed circuit board; and a first circuit switching condition resulting in a first illuminating depiction of one LED element and indicating an open circuit operating condition of said relay, a second circuit switching condition resulting in a second illuminating depiction of another LED element and indicating a partially open circuit operating condition.

2. The relay as described in claim 1, said at least one LED further comprising first and second LED elements electrically communicable with said circuit board and viewable from respective first and second exterior locations of said housing.

3. The relay as described in claim 2, said three dimensional housing having a specified shape and size and including at least a top face, said first and second LED elements being visible from opposite edge locations of said top face.

4. The relay as described in claim 2, said first LED illuminating according to a first selected color and upon occurrence of said open circuit operating condition, said second LED illuminating according to a second selected color and upon occurrence of said partially open circuit condition.

5. The relay as described in claim 3, said field effect transistor further comprising a MOSFET transistor.

6. The relay as described in claim 1, said at least one female circuit board terminal further comprising first and second female terminals, said fuse further comprising first and second spaced apart and extending blade portions engageable, respectively, with said first and second female terminals.

7. The relay as described in claim 5, further comprising an over-current protection device in operative communication with an output of said MOSFET, said first LED being connected in parallel configuration with said current protection device and emitting said first depiction upon said current protection device ceasing to pass current.

8. The relay as described in claim 7, said current protection device further comprising a fuse.

9. The relay as described in claim 5, further comprising a differential amplifier electrically communicating in parallel with an over-current protection device.

10. The relay as described in claim 9, further comprising said differential amplifier multiplying a voltage present across said current protection device and outputting a representative signal to a comparator.

11. The relay as described in claim 10, further comprising said second LED being connected to an output of said comparator, and whereupon said comparator receiving a signal from said differential amplifier which meets a predetermined threshold, said comparator switches state so that current passes to said second LED and emits said second depiction.

12. The relay as described in claim 1, said three dimensional housing further comprising a substantially cubicle shape.

13. A self diagnostic solid state relay, comprising:

a three dimensional polygonal shaped housing enclosing a printed circuit board;

a MOSFET field effect transistor, a pair of female circuit board terminals, and a pair of LED elements being electrically communicable with said printed circuit board and located on a first side of said printed circuit board, said LED elements being viewable from an exterior location of said housing;

a fuse including first and second spaced apart and extending blade portions engageable, respectively, with said first and second female terminals through openings defined in said housing;

a plurality of male circuit board terminals being in electrical communication with said printed circuit board and located on a second side of said printed circuit board and extending from further selected exterior locations of said housing, said MOSFET, LED elements, fuse and male and female terminals in electrical communication via the printed circuit board; and a first circuit switching condition resulting in a first illuminating depiction of one LED element and indicating an open circuit operating condition of said relay, a second circuit switching condition resulting in a second illuminating depiction of said other LED element and indicating a partially open circuit operating condition.

* * * * *